United States Patent
Oshima

(10) Patent No.: US 7,728,323 B2
(45) Date of Patent: Jun. 1, 2010

(54) NITRIDE-BASED SEMICONDUCTOR SUBSTRATE, METHOD OF MAKING THE SAME AND EPITAXIAL SUBSTRATE FOR NITRIDE-BASED SEMICONDUCTOR LIGHT EMITTING DEVICE

(75) Inventor: Yuichi Oshima, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/538,638

(22) Filed: Oct. 4, 2006

(65) Prior Publication Data

US 2007/0246733 A1    Oct. 25, 2007

(30) Foreign Application Priority Data

Apr. 21, 2006   (JP) .............................. 2006-117856

(51) Int. Cl.
  *H01L 33/00* (2010.01)
(52) U.S. Cl. .............................. 257/13; 257/12; 257/94; 257/E33.023; 257/E33.025; 117/84; 117/103; 117/104
(58) Field of Classification Search .................... 257/12, 257/13, 94, E33.023, E33.025; 117/84, 103, 117/104
  See application file for complete search history.

(56) References Cited

U.S. PATENT DOCUMENTS

| 5,290,393 | A | 3/1994 | Nakamura | |
| 6,342,748 | B1* | 1/2002 | Nakamura et al. | 310/313 A |
| 2003/0183158 | A1* | 10/2003 | Maruska et al. | 117/84 |
| 2005/0066885 | A1* | 3/2005 | Kamiyama et al. | 117/84 |
| 2005/0098095 | A1* | 5/2005 | D'Evelyn et al. | 117/105 |
| 2005/0183658 | A1* | 8/2005 | Nakahata et al. | 117/2 |
| 2006/0011135 | A1* | 1/2006 | Dmitriev et al. | 118/718 |

FOREIGN PATENT DOCUMENTS

JP        4-297023 A    10/1992

OTHER PUBLICATIONS

Liu, temperature dependence of thermal conductivity of AlGaN thin films measured by the differential 3w technique, Appl. Phys. Lett. 29, pp. 5230-5232, 2004.*

D. I. Florescu et al., High Spatial Resolution Thermal Conductivity and Raman Spectroscopy Investigation of Hydride Vapor Phase Epitaxy Grown $n$-GaN/sapphire (0001): Doping Dependence, Journal of Applied Physics, vol. 88, No. 6, Sep. 15, 2000.

* cited by examiner

*Primary Examiner*—Kiesha R Bryant
*Assistant Examiner*—Minchul Yang
(74) *Attorney, Agent, or Firm*—Foley & Lardner LLP

(57) ABSTRACT

A nitride-based semiconductor substrate has a substrate formed of a nitride-based semiconductor crystal having a mixed crystal composition with three elements or more. The substrate has a diameter of not less than 25 mm, and a thermal resistivity in a range of 0.02 $Kcm^2/W$ to 0.5 $Kcm^2/W$ in its thickness direction.

8 Claims, 4 Drawing Sheets

11 SAPPHIRE SUBSTRATE

12 GaN FILM

13 Ti FILM

FIG. 2D
14 POROUS TiN

15 FACET GROWTH AlGaN

17 AlGaN THICK FILM
16 VOID

18 AlGaN FREE-STANDING SUBSTRATE

NITRIDE-BASED SEMICONDUCTOR SUBSTRATE, METHOD OF MAKING THE SAME AND EPITAXIAL SUBSTRATE FOR NITRIDE-BASED SEMICONDUCTOR LIGHT EMITTING DEVICE

The present application is based on Japanese patent application No. 2006-117856, the entire contents of which are incorporated herein by reference.

BACKGROUND OF THE INVENTION

1. Field of the Invention

This invention relates to a nitride-based semiconductor substrate that its epi-characteristics can be kept uniform in plane, even when the nitride-based semiconductor is formed with a mixed crystal of three elements or more, to provide a high yield and a high reliability with its device. Also, this invention relates to a method of making the nitride-based semiconductor substrate, and to an epitaxial substrate for a nitride-based semiconductor light emitting device using the nitride-based semiconductor substrate.

2. Description of the Related Art

Nitride-based semiconductor devices, such as gallium nitride (GaN), indium gallium nitride (InGaN) and gallium aluminum nitride (AlGaN) attract attention for a material of blue light emitting diode (LED) or laser diode (LD). Further, since the GaN-based compound semiconductors have a good heat resistance and environment resistance, they have begun to be applied to other electronic devices.

Thus far, in growing GaN which is a typical nitride-based semiconductor, sapphire single crystal substrates have been used.

However, since the sapphire substrates are not lattice-matched with the GaN, a GaN single crystal film cannot be grown directly on the sapphire substrate. Therefore, a method is developed in which a buffer layer (=low-temperature growth buffer layer) of AlN or GaN is grown on the sapphire substrate at low temperature to buffer a strain in lattice, and then GaN is grown thereon (e.g., JP-A-H04-297023).

By virtue of the low-temperature growth buffer layer, the epitaxial growth of GaN single crystal can be realized. However, the above method still has a problem that the grown GaN has a number of defects since the lattice mismatch between the substrate and the GaN crystal is not perfectly eliminated. It is assumed that the defects will bring some failure in fabricating a GaN-based LD and high-brightness LED.

Because of this, it is desired to develop a GaN free-standing substrate not to cause the lattice mismatch between it and the GaN crystal. Since it is difficult to grow a large ingot of GaN from a melt as in the cases of Si or GaAs, various methods such as the HVPE (hydride vapor phase epitaxy), the ultra-high temperature and pressure method, and the flux method have been tried to make the GaN free-standing substrate. Especially, the development of the GaN free-standing substrate by HVPE is most advanced. The GaN free-standing substrates by HVPE have gradually begun to be commercially available.

A high-quality GaN is reported which has a thermal conductivity as high as about 2 W/cmK (e.g., D. I. Florescu et al., "High spatial resolution thermal conductivity and Raman spectroscopy investigation of hydride vapor phase epitaxy grown n-GaN/sapphire (0001): Doping dependence", Journal of Applied Physics 88(6) (2000) p 3295). This value is about five times the sapphire (0.42 W/cmK) and is a very high value close to aluminum (2.4 W/cmK). Thus, by using the high-quality GaN, a free-standing substrate with a high heat radiation property can be produced.

In recent years, nitride-based semiconductor substrates, such as AlGaN, with a mixed crystal composition of three elements or more have been researched.

However, when the nitride-based semiconductor is formed with a mixed crystal of three elements or more, the thermal conductivity will be reduced significantly. For example, in case of $Al_xGa_{1-x}N$ (x=0.1), its thermal conductivity becomes reduced to about ¼ of GaN. The reduction in thermal conductivity is most significant in x=0.05 to 0.95. If the substrate with the reduced thermal conductivity is used to conduct the epitaxial growth thereon, fluctuation in temperature will occur to generate nonuniform epi-characteristics in the plane of the substrate. As a result, the yield of the device will lower.

SUMMARY OF THE INVENTION

It is an object of the invention to provide a nitride-based semiconductor substrate that its epi-characteristics can be kept uniform in plane, even when the nitride-based semiconductor is formed with a mixed crystal of three elements or more, to provide a high yield and a high reliability with its device.

As the result of researches for a high-performance and high-output nitride-based semiconductor device, the inventor has found that thermal resistance of a substrate is a more important factor than thermal conductivity thereof so as to radiate rapidly excessive heat to improve efficiency and lifetime of a device.

Further, the inventor has found that, even in nitride-based semiconductor crystal essentially having a composition of low thermal conductivity, its heat uniformity can be improved by optimizing the thickness or crystalline quality to lessen the absolute value of thermal resistance in the thickness direction so that the epi-characteristics are uniformed.

(1) According to one aspect of the invention, a nitride-based semiconductor substrate comprises:

a substrate comprising a nitride-based semiconductor crystal comprising a mixed crystal composition with three elements or more, wherein the substrate further comprises a diameter of not less than 25 mm, and a thermal resistivity in a range of 0.02 $Kcm^2/W$ to 0.5 $Kcm^2/W$ in its thickness direction.

In the above invention (1), the following modifications and changes can be made.

(i) The mixed crystal composition comprises $Al_xGa_{1-x}N$ (0.05<x<0.95)

(ii) The mixed crystal composition comprises $In_yGa_{1-y}N$ (0.05<x<0.95)

(iii) The mixed crystal composition comprises $Al_zIn_pGa_{1-z-p}N$ (0.05<z+p<0.95, z≠0, p≠0)

(iv) The substrate further comprises a threading dislocation density of not more than $1\times10^7$ $cm^{-2}$.

(v) The substrate comprises a total point defect concentration of not more than $1\times10^{18}$ $cm^{-3}$, the point defect concentration excluding a dopant for controlling conductivity of the substrate.

(2) According to another aspect of the invention, a method of making a nitride-based semiconductor substrate comprises the steps of:

providing a hetero-substrate with a diameter of not less than 25 mm;

epitaxially growing, on the hetero-substrate, a nitride-based semiconductor crystal comprising a mixed crystal composition with three elements or more and a thickness of not less than 2 mm; and removing the hetero-substrate to have the nitride-based semiconductor substrate comprising a thermal resistivity in a range of 0.02 Kcm²/W to 0.5 Kcm²/W in its thickness direction.

In the above invention (2), the following modifications and changes can be made.

(vi) The method further comprises: forming a void at an interface between the hetero-substrate and the nitride-based semiconductor crystal; and then breaking the void to remove the hetero-substrate.

(3) According to another aspect of the invention, a method of making a nitride-based semiconductor substrate comprises the steps of:

forming a Ti film on a sapphire substrate with a diameter of not less than 25 mm and with a GaN film formed thereon;

heating the sapphire substrate in a mixed gas atmosphere comprising hydrogen gas and ammonia gas to transform the Ti film into a TiN thin film comprising a number of pores;

growing a AlGaN crystal with a thickness of not more than 2 mm on the TiN thin film by the HVPE method;

breaking a void formed at an interface between the sapphire substrate and the AlGaN crystal to separate the AlGaN crystal from the sapphire substrate so as to have an AlGaN free-standing substrate comprising a thermal resistivity in a range of 0.02 Kcm²/W to 0.5 Kcm²/W in its thickness direction.

(4) According to another aspect of the invention, an epitaxial substrate for a nitride-based semiconductor light emitting device comprises:

the nitride-based semiconductor substrate as defined in the above invention (1); and a light emitting layer comprising a nitride-based semiconductor grown epitaxially on the nitride-based semiconductor substrate.

<Advantages of the Invention>

A nitride-based semiconductor substrate of the invention has a predetermined thermal resistivity in the thickness direction. Therefore, even when using a nitride-based semiconductor with a three elements or more mixed crystal composition having a low thermal resistivity, in-plane uniformity of epi-characteristics can be secured so as to have a high yield and high reliability of the device.

By a method of making a nitride-based semiconductor substrate of the invention, the nitride-based semiconductor substrate with the above characteristics can be produced efficiently.

An epitaxial substrate for a nitride-based semiconductor light emitting device of the invention uses the nitride-based semiconductor substrate with the above characteristics. Thus, the epitaxial substrate can have a reduced in-plane variation of emission center wavelength to offer excellent emission properties.

BRIEF DESCRIPTION OF THE DRAWINGS

The preferred embodiments according to the invention will be explained below referring to the drawings, wherein:

FIGS. 2A to 2G are schematic cross sectional views showing a method of making an AlGaN free-standing substrate in Examples 1-3 and Comparative Examples 1-3;

DETAILED DESCRIPTION OF THE PREFERRED EMBODIMENTS

Figure 1:
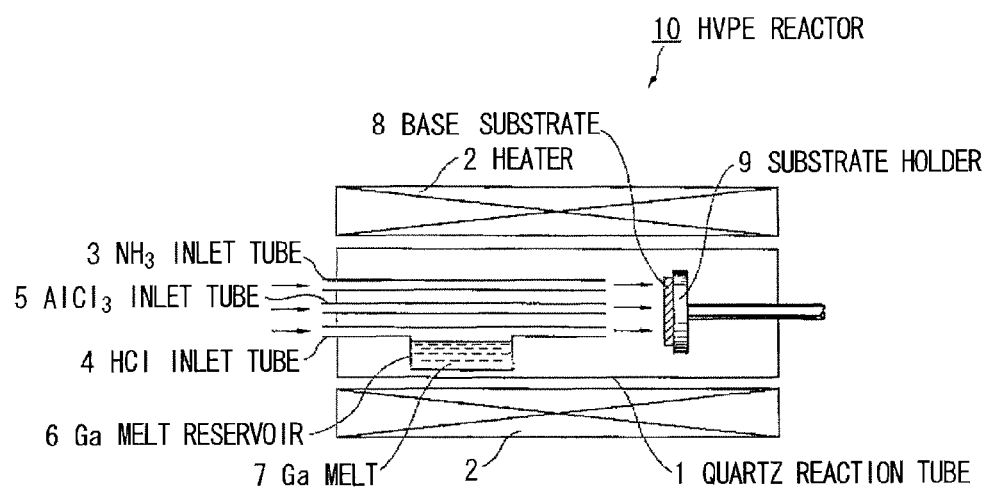
FIG. 1 is a schematic diagram showing an HVPE reactor used in Examples according to the invention and Comparative Examples.

A nitride-based semiconductor substrate and a method of making the substrate in preferred embodiments of the invention will be described below.

Size of Substrate

The nitride-based semiconductor substrate of the embodiment has a diameter of 25 mm or more, preferably 50 mm or more so as to prevent a reduction in productivity of the substrate. It is desirable that the substrate has a thickness greater than 250 μm. If less than 250 μm in thickness, it becomes difficult to handle the substrate due to a reduction in mechanical strength thereof.

Thermal Resistance Value

Although a nitride-based semiconductor with mixed crystal composition of three elements or more has a low thermal conductivity, an important factor during the epi-growth or the heat radiation of a device is the absolute value of thermal resistance rather than the thermal conductivity. If the thermal resistance is large, in-plane distribution of temperature will be generated during the epi-growth of the device. The mechanism originates mainly in occurrence of warping caused by temperature distribution in the thickness direction. The device epi-growth is mostly conducted by MOVPE. Heating of a substrate in MOVPE is conducted such that the substrate is in general placed on a susceptor where the substrate is heated by thermal conduction. In that case, although the back surface of the substrate is subjected to high temperatures by being contacted with the susceptor as a heat generator, a top surface thereof is likely subjected to low temperatures because it is exposed to radiation or cold source gas and carrier gas. As the thermal resistance of the substrate is increased, the temperature difference therebetween will be increased. When the temperature difference occurs, the substrate is warped in concave form due to non-uniformity in thermal expansion. When it is warped, the periphery of the substrate is lifted from the susceptor and its temperature lowers relatively. Thus, the in-plane temperature distribution of the substrate during the device epi-growth is generated.

Range of Thermal Resistance Value

When the abovementioned temperature distribution is generated, the composition of an active layer (InGaN) of a light emitting device is rendered uneven whereby its emission wavelength fluctuates and the yield is reduced. The upper limit of the thermal resistance value not to cause the unevenness of temperature is about 0.5 Kcm²/W or less, although it depends on the composition or thickness of the substrate crystal, the reactor to be used, or growth conditions. The lower limit of the thermal resistance value is as low as possible, but a substrate having a thermal resistance of less than 0.02 Kcm²/W is generally very thin so that its strength will not be sufficient in handling or conducting the device fabrication process. Therefore, the lower limit is substantially about 0.02 Kcm²/W.

Point Defect Concentration

Phonon is a carrier of thermal conduction in a semiconductor material. Phonon is scattered by a point defect (i.e., impurity or void) located in crystal to reduce the thermal conductivity, i.e., to increase the thermal resistivity. Therefore, in order to reduce the thermal resistance, it is important to reduce the point defect concentration. Although the point defect includes a dopant to control the conductivity, the concentration of the dopant is practically impossible to reduce since it is needed to have a predetermined conductivity. Thus, it is important to reduce the background impurity concentration other than the dopant. Although the influence depends on the kind of impurity, when the total concentration of the background included in crystal exceeds about $1\times10^{18}$ cm$^{-3}$, the influence is likely to appear. Therefore, it is necessary to render the background concentration less than such a value.

Thickness of Substrate

Even if the thermal conductivity is low, the thermal resistivity can be lowered generally by reducing the thickness. However, when the substrate thickness is reduced, a new problem arises that the substrate is easy to be cracked. In general, a nitride-based semiconductor substrate is made by such a process that a nitride-based semiconductor single crystal is grown on a hetero-substrate by HVPE etc. and then the hetero-substrate is separated or removed. When the nitride-based semiconductor single crystal is small in thickness, it is easy to crack in removing the hero-substrate. Especially, in case of AlGaN, since it is high in decomposition temperature, it is necessary to heat it more intensely than GaN when using the conventional laser separation. In this case, since large temperature rise may occur locally, probability of crack occurrence will increase significantly. In contrast, the probability of crack occurrence can be reduced by increasing considerably the thickness of the growth layer. However, this is not practical since a very thick film with a thickness of several millimeters or more needs to be grown to get that effect. If such a thick film is obtained, AlGaN is much harder than GaN and is difficult to process by chemical polishing, so that it is hard to reduce in thickness. On the other hand, it may be assumed that the AlGaN is grown on a substrate formed of GaAs etc. easy to be etched. However, the substrate of GaAs or the like with a low decomposition temperature cannot endure the growth temperature of the AlGaN which is typically 100° C. or more higher than GaN.

In this embodiment, by using the VAS (void-assisted separation) method, the separation of an AlGaN thin layer (with a thickness of 2 mm or less) from a sapphire substrate to endure high temperature can be made possible. The VAS method is a method to conduct the crystal growth while sandwiching a titanium nitride thin film between the sapphire substrate and the GaN growth layer. JP-A-2003-178984 describes the details of the VAS method.

Method of Making a Nitride-Based Semiconductor Substrate

The nitride-based semiconductor substrate of the embodiment can be made by using the VAS method as follows.

I: Step of Forming Nitride Thin Film on Hetero-Substrate

At first, a nitride-based semiconductor layer is formed on a sapphire substrate as a seed (or base) substrate by MOVPE etc., and then a specified metal such as titanium, nickel, tantalum and tungsten is stacked thereon and heated in an atmosphere containing hydrogen ad ammonium. Thereby, the metal is nitrided and agglomerated to provide a structure (nanomask) with a number of microscopic pores. The nanomask allows the relaxation of strain caused by a lattice mismatch or especially a thermal expansion coefficient difference between a nitride-based semiconductor layer to be grown thereon and the sapphire substrate. In particular, when titanium is stacked as the metal and the surface thereof is nitrided, the titanium nitride also functions as a buffer layer for the nitride-based semiconductor so that the nitride-based semiconductor can be grown with a good crystalline quality. For example, threading dislocation density can be rendered $1\times10^7$ cm$^{-2}$ or less and the total point defect density other than the dopant can be rendered $1\times10^{18}$ cm$^{-3}$ or less.

The metal film can be stacked by using the deposition, sputtering, various CVD methods etc. In order to reduce the defect density in the nitride-based semiconductor layer to be grown, it is desired that the pores are uniformly dispersed on the surface of the metal film. The formation of the pores can be controlled by the thickness of the metal film, the thickness of the nitride-based semiconductor layer on the sapphire substrate or the thermal conditions. For example, in order to nitride the metal film to have nearly uniform pores with a size of 100 nm or less, it is desirable to conduct the thermal treatment at temperature of 700° C. to 1400° C. This is because the nitriding reaction is not sufficiently performed under 700° C. so that the uniform pores cannot be obtained. If exceeding 1400° C., the thermal decomposition of the nitride-based semiconductor layer may be excessively performed to separate the metal nitride film. On the other hand, it is preferred that the thickness of the metal film is 1 μm or less. If exceeding 1 μm, the metal film may lose the flatness of its surface so that defects become likely to be generated in the nitride-based semiconductor layer to be grown thereon. The atmosphere of the heat treatment can be hydrogen gas or mixed gas containing hydrogen. The mixed gas containing hydrogen may be, e.g., 80 to 60% of hydrogen gas and 20 to 40% of ammonium.

II: Step of Forming Nitride-Based Semiconductor Thick Film by HVPE

Then, the nitride-based semiconductor thick film is formed on the nitride film by HVPE.

FIG. 1 is a schematic diagram showing an HVPE reactor used in the embodiment.

The HVPE reactor 10, which is a hot-wall type with a heater 2 outside a horizontally long quartz reactor tube 1, comprises, on the left side (i.e., upstream side) of the quartz reactor tube 1, an NH$_3$ inlet tube 3 to introduce NH$_3$ gas as a group V source, an HCl inlet tube 4 to introduce HCl gas for forming GaCl as a group III source, and an AlCl$_3$ inlet tube 5 to introduce AlCl$_3$ as a group III source.

The HCl inlet tube 4 is halfway enlarged in its inside diameter to provide a Ga melt reservoir 6 to contain a Ga melt 7.

A substrate holder 9 with a seed (or base) substrate 8 placed thereon is rotatably and movably disposed on the right side (i.e., downstream side) of the quartz reactor tube 1.

In growing, e.g., AlGaN by using the HVPE reactor 10, the NH$_3$ gas as the group V source is introduced through the NH$_3$ inlet tube 3, the HCl gas to form the group III source through the HCl inlet tube 4, and the AlCl$_3$ as the group III source through the AlCl$_3$ inlet tube 5. Meanwhile, the source gas, i.e., HCl gas, AlCl$_3$ gas and NH$_3$ gas are introduced mixed with a carrier gas such as H$_2$ gas to control the reactivity.

In the HCl inlet tube 4, the HCl gas is halfway contacted with the Ga melt 7 and thereby a reaction: Ga+HCl→GaCl+(½)H$_2$ is conducted to produce gallium chloride, GaCl.

The mixed gas of GaCl gas and H$_2$ carrier gas, the mixed gas of AlCl$_3$ gas introduced through the AlCl$_3$ inlet tube 5 and H$_2$ carrier gas, and the mixed gas of NH$_3$ and H$_2$ carrier gas are conveyed in a direction as shown by arrows in FIG. 4 in the space of the quartz reactor tube 1. Then, a reaction: GaCl+AlCl$_3$+NH$_3$+(½)H$_2$→AlGaN+4HCl is conducted on the seed (or base) substrate 8 placed on the substrate holder 9 to deposit AlGaN on the seed (or base) substrate 8. In the HVPE method, the AlGaN single crystal is epitaxially grown at an atmosphere temperature of about 1000 to 1150° C. Waste gas is removed through a waste gas outlet (not shown) Meanwhile, when doping a suitable dopant for AlGaN such as Si, Mg, Fe, S, O, Zn, Ni, Cr, Se etc., the doping gas can be introduced through a doping tube (not shown).

III: Step of Separating Hetero-Substrate by the VAS Method

Then, by breaking the voids formed at the interface between the hetero-substrate and the nitride-based semiconductor layer, the nitride-based semiconductor thick film crystal thus grown can be separated from the hetero-substrate to obtain the nitride-based semiconductor free-standing substrate.

In the VAS method, since the void layer exists between the hetero-substrate and the nitride-based semiconductor layer, the hetero-substrate can be easy removed. Thereby, the free-standing substrate of nitride-based semiconductor single crystal with a large diameter and no crack or scratch can be obtained.

EXAMPLE 1

FIGS. 2A to 2G are schematic cross sectional views showing a method of making an AlGaN free-standing substrate in Examples 1-3.

An AlGaN free-standing substrate is made by a process as shown in FIGS. 2A to 2G.

Figure 2A:
Figure 2B:
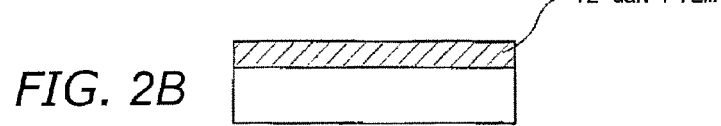
Figure 2C:
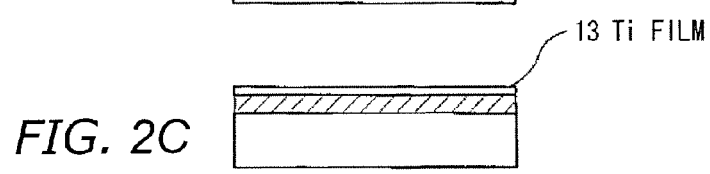
Figure 2E:
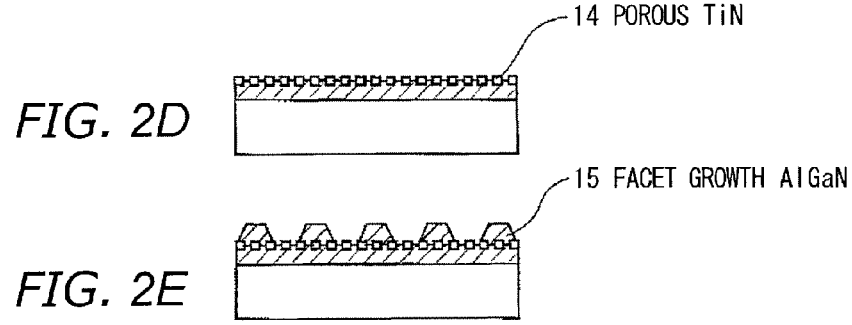

First, a sapphire substrate 11 with a diameter of 2 inches (=50.8 mm) is provided as a seed (or base) substrate (FIG. 2A) Then, a GaN film 12 is formed 300 nm thick on the sapphire substrate 11 by MOVPE (FIG. 2B). Then, a Ti film 13 is vacuum-deposited 20 nm thick (FIG. 2C) thereon, and then heated at 1000° C. for 30 min. in a mixed atmosphere of $H_2$ and $NH_3$. By the heat treatment, the Ti film 13 on the surface of the substrate is nitrided such that it is changed into a porous TiN 14 with a number of microscopic pores with an inside diameter of tens of nanometers by the coalescence effect (FIG. 2D).

Then, it is placed in the HVPE reactor 10 as shown in FIG. 1 and an $Al_{0.05}Ga_{0.95}N$ thick film 17 is grown 500 μm thick on the seed (or base) substrate 8 (here, the substrate with the porous TiN 14 formed on the surface as shown in FIG. 2D corresponds to the seed (or base) substrate 8 as shown in FIG. 1) The growth temperature is set 1100° C. In this process, the stay time of the HCl gas introduced to the Ga melt reservoir 6 is adjusted to be about 2 min. by controlling the flow rate of HCl. Further, Si doping is conducted by introducing $SiH_2Cl_2$ gas with a predetermined concentration through the doping tube (not shown) to adjust the Si concentration in the crystal to $3 \times 10^{18}$ cm$^{-3}$.

In the crystal growth process, a facet growth AlGaN 15 is grown on the initial stage (FIG. 2E) and then is combined each other to form a continuous film. About 30 μm is needed to allow the flattening of the crystal surface.

A number of voids are formed on the interface of the porous film in the process of the HVPE growth (FIG. 5F) Therefore, the AlGaN thick film 17 is by itself separated from the sapphire substrate 11 after the growth. Then, by polishing the AlGaN thick film 17, the AlGaN free-standing substrate 18 with a diameter of 2 inches and a thickness of 250 μm is obtained (FIG. 2G).

The threading dislocation density of the obtained AlGaN free-standing substrate 18 measured by the cathode luminescence method is a very good value, $3 \times 10^6$ cm$^{-2}$. As the result of measuring the respective concentrations of H, C, O, Na, K, Cl, S, P, Fe, Cr, Ni and Ti by SIMS analysis, all of them are below the respective detection lower limits (which (atoms/cm$^3$) are H: $1 \times 10^{17}$, C: $9 \times 10^{15}$, O: $2 \times 10^{16}$, P: $3 \times 10^{15}$, S: $5 \times 10^{14}$, Cl: $1 \times 10^{15}$, Na: $6 \times 10^{13}$, K: $5 \times 10^{14}$, Ti: $3 \times 10^{13}$, Cr: $3 \times 10^{14}$, Fe: $3 \times 10^{15}$, Ni: $2 \times 10^{15}$). It is assumed that such a high purity is caused by that the stay time of HCl gas in the Ga melt reservoir 6 is long enough to purify the source gas, and that the flattening occurs early enough to shorten the facet growth period that is easy to absorb the impurity. Further, it is confirmed by the laser flash method that the thermal resistivity is as low as 0.02 Kcm$^2$/W. It is assumed that the low thermal resistivity is caused by the low point defect concentration, which is likely to be generated by stress field of dislocation, obtained due to the low threading dislocation density as well as the low impurity concentration.

Figure 3:
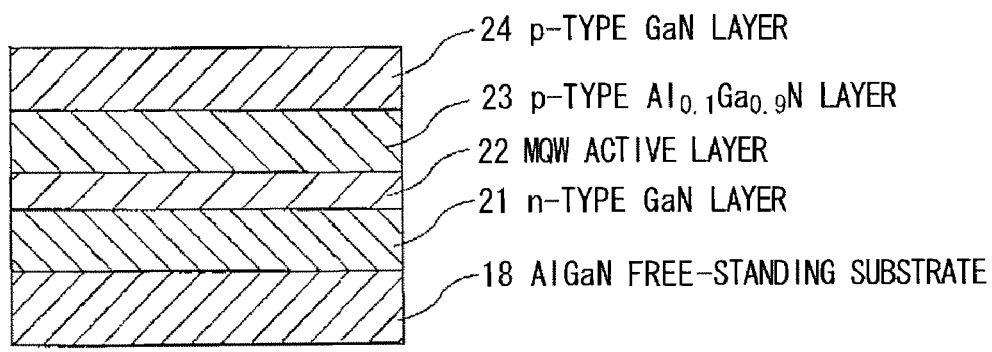
FIG. 3 is a schematic cross sectional view showing an LED structure as fabricated in Examples 1-3 and Comparative Examples 1-3.

Then, an LED structure as shown in FIG. 3 is fabricated by sequentially growing, on the AlGaN free-standing substrate 18 thus obtained, a 4 μm thick n-type GaN layer 21, an $In_{0.15}Ga_{0.85}N/GaN$-3-MQW active layer (with 3 nm thick well layers and 10 nm thick barrier layers), a 40 nm thick p-type $Al_{0.1}Ga_{0.9}N$ layer 23, a 500 nm thick p-type GaN layer 24 by MOVPE.

The crystalline quality of the epitaxial layers is good and its emission center wavelength is so uniform as ±1.1% in in-plane variation. The in-plane variation of the emission center wavelength is measured at 202000 points, at intervals of 0.1 mm, in the plane of the substrate by a wavelength mapping measuring apparatus. The measurement results are 465 nm in average emission center wavelength and 5 nm in standard deviation. The variation is obtained by calculating: (variation)=(standard deviation)/(average emission center wavelength).

It is assumed that the above results are caused by that sufficient heating can be conducted due to the low thermal resistivity of the substrate so as not to generate a warping in the process of the growth. Thus, it is confirmed according to the invention that the in-plane variation of the emission center wavelength in the epitaxial substrate for light emitting device can be reduced to ±2% or less.

EXAMPLE 2

An AlGaN free-standing substrate is made by a process as shown in FIGS. 2A to 2G.

First, a sapphire substrate 11 with a diameter of 2 inches (=50.8 mm) is provided as a seed (or base) substrate (FIG. 2A). Then, a GaN film 12 is formed 300 nm thick on the sapphire substrate 11 by MOVPE (FIG. 2B). Then, a Ti film 13 is vacuum-deposited 20 nm thick (FIG. 2C) thereon, and then heated at 1000° C. for 30 min. in a mixed atmosphere of $H_2$ and $NH_3$. By the heat treatment, the Ti film 13 on the surface of the substrate is nitrided such that it is changed into a porous TiN 14 with a number of microscopic pores with an inside diameter of tens of nanometers by the agglomeration effect (FIG. 2D).

Then, it is placed in the HVPE reactor 10 as shown in FIG. 1 and an $Al_{0.1}Ga_{0.9}N$ thick film 17 is grown 500 μm thick on the seed (or base) substrate 8 (here, the substrate with the porous TiN 14 formed on the surface as shown in FIG. 2D corresponds to the seed (or base) substrate 8 as shown in FIG. 1) The growth temperature is set 1100° C. In this process, the stay time of the HCl gas introduced to the Ga melt reservoir 6 is adjusted to be about 2 min. by controlling the flow rate of HCl. Further, Si doping is conducted by introducing $SiH_2Cl_2$ gas with a predetermined concentration through the doping tube (not shown) to adjust the Si concentration in the crystal to $3\times10^{18}$ cm$^{-3}$.

In the crystal growth process, a facet growth AlGaN 15 is grown on the initial stage (FIG. 2E) and then is combined each other to form a continuous film. About 30 μm is needed to allow the flattening of the crystal surface.

A number of voids are formed on the interface of the porous film in the process of the HVPE growth (FIG. 5F). Therefore, the AlGaN thick film 17 is by itself separated from the sapphire substrate 11 after the growth. Then, by polishing the AlGaN thick film 17, the AlGaN free-standing substrate 18 with a diameter of 2 inches and a thickness of 420 μm is obtained (FIG. 2G).

The threading dislocation density of the obtained AlGaN free-standing substrate 18 measured by the cathode luminescence method is a very good value, $3\times10^{6}$ cm$^{-2}$. As the result of measuring the respective concentrations of H, C, O, Na, K, Cl, S, P, Fe, Cr, Ni and Ti by SIMS analysis, all of them are below the respective detection limits. It is assumed that such a high purity is caused by that the stay time of HCl gas in the Ga melt reservoir 6 is long enough to purify the source gas, and that the flattening occurs early enough to shorten the facet growth period that is easy to absorb the impurity. Further, it is confirmed by the laser flash method that the thermal resistivity is as low as 0.067 Kcm$^2$/W. It is assumed that the low thermal resistivity is caused by the low point defect concentration, which is likely to be generated by stress field of dislocation, obtained due to the low threading dislocation density as well as the low impurity concentration.

Then, an LED structure as shown in FIG. 3 is fabricated by sequentially growing, on the AlGaN free-standing substrate 18 thus obtained, a 4 μm thick n-type GaN layer 21, an In$_{0.15}$Ga$_{0.85}$N/GaN-3-MQW active layer (with 3 nm thick well layers and 10 nm thick barrier layers), a 40 nm thick p-type Al$_{0.1}$Ga$_{0.9}$N layer 23, a 500 nm thick p-type GaN layer 24 by MOVPE.

The crystalline quality of the epitaxial layers is good. Further, the results of measurement as in Example 1 are 465 nm in average emission center wavelength and 5 nm in standard deviation, and the in-plane variation of the emission center wavelength is so uniform as ±1.1%.

It is assumed that the above results are caused by that sufficient heating can be conducted due to the low thermal resistivity of the substrate so as not to generate a warping in the process of the growth.

EXAMPLE 3

An AlGaN free-standing substrate is made by a process as shown in FIGS. 2A to 2G.

First, a sapphire substrate 11 with a diameter of 2 inches (=50.8 mm) is provided as a seed (or base) substrate (FIG. 2A). Then, a GaN film 12 is formed 300 nm thick on the sapphire substrate 11 by MOVPE (FIG. 2B). Then, a Ti film 13 is vacuum-deposited 20 nm thick (FIG. 2C) thereon, and then heated at 1000° C. for 30 min. in a mixed atmosphere of H$_2$ and NH$_3$. By the heat treatment, the Ti film 13 on the surface of the substrate is nitrided such that it is changed into a porous TiN 14 with a number of microscopic pores with an inside diameter of tens of nanometers by the coalescence effect (FIG. 2D).

Then, it is placed in the HVPE reactor 10 as shown in FIG. 1 and an Al$_{0.5}$Ga$_{0.5}$N thick film 17 is grown 500 μm thick on the seed (or base) substrate 8 (here, the substrate with the porous TiN 14 formed on the surface as shown in FIG. 2D corresponds to the seed (or base) substrate 8 as shown in FIG. 1). The growth temperature is set 1100° C. In this process, the stay time of the HCl gas introduced to the Ga melt reservoir 6 is adjusted to be about 2 min. by controlling the flow rate of HCl. Further, Si doping is conducted by introducing SiH$_2$Cl$_2$ gas with a predetermined concentration through the doping tube (not shown) to adjust the Si concentration in the crystal to $3\times10^{18}$ cm$^{-3}$.

In the crystal growth process, a facet growth AlGaN 15 is grown on the initial stage (FIG. 2E) and then is combined each other to form a continuous film. About 30 μm is needed to allow the flattening of the crystal surface.

Figure 2F:
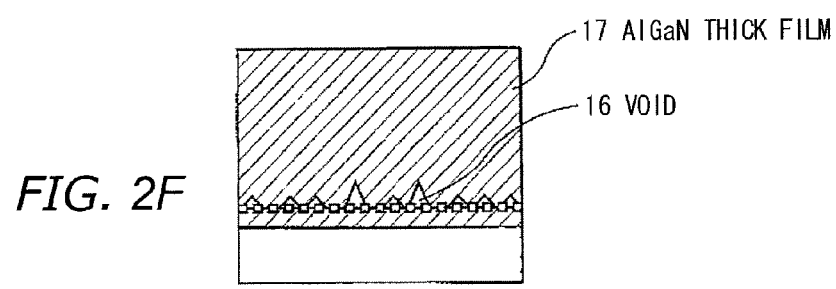
Figure 2G:
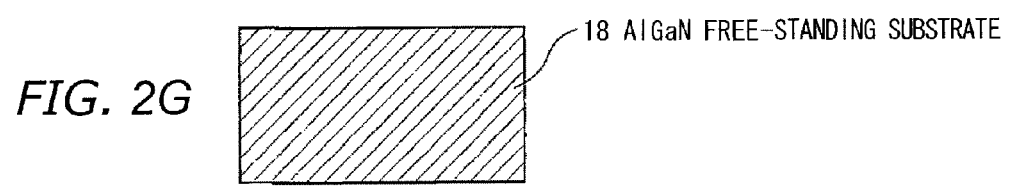

A number of voids 16 are formed on the interface of the porous film in the process of the HVPE growth (FIG. 2F). Therefore, the AlGaN thick film 17 is by itself separated from the sapphire substrate 11 after the growth. Then, by polishing the AlGaN thick film 17, the AlGaN free-standing substrate 18 with a diameter of 2 inches and a thickness of 420 μm is obtained (FIG. 2G).

The threading dislocation density of the obtained AlGaN free-standing substrate 18 measured by the cathode luminescence method is a very good value, $3\times10^{6}$ cm$^{-2}$. As the result of measuring the respective concentrations of H, C, O, Na, K, Cl, S, P, Fe, Cr, Ni and Ti by SIMS analysis, all of them are below the respective detection limits. It is assumed that such a high purity is caused by that the stay time of HCl gas in the Ga melt reservoir 6 is long enough to purify the source gas, and that the flattening occurs early enough to shorten the facet growth period that is easy to absorb the impurity. Further, it is confirmed by the laser flash method that the thermal resistivity is as low as 0.5 Kcm$^2$/W. It is assumed that the low thermal resistivity is caused by the low point defect concentration, which is likely to be generated by stress field of dislocation, obtained due to the low threading dislocation density as well as the low impurity concentration.

Then, an LED structure as shown in FIG. 3 is fabricated by sequentially growing, on the AlGaN free-standing substrate 18 thus obtained, a 4 μm thick n-type GaN layer 21, an In$_{0.15}$Ga$_{0.85}$N/GaN-3-MQW active layer (with 3 nm thick well layers and 10 nm thick barrier layers) 22, a 40 m thick p-type Al$_{0.1}$Ga$_{0.9}$N layer 23, a 500 nm thick p-type GaN layer 24 by MOVPE.

The crystalline quality of the epitaxial layers is good. Further, the results of measurement as in Example 1 are 465 nm in average emission center wavelength and 5 nm in standard deviation, and the in-plane variation of the emission center wavelength is so uniform as ±1.1%.

It is assumed that the above results are caused by that sufficient heating can be conducted due to the low thermal resistivity of the substrate so as not to generate a warping in the process of the growth.

COMPARATIVE EXAMPLE 1

An AlGaN free-standing substrate is made by a process as shown in FIGS. 2A to 2G.

First, a sapphire substrate 11 with a diameter of 2 inches (=50.8 mm) is provided as a seed (or base) substrate (FIG. 2A). Then, a GaN film 12 is formed 300 nm thick on the sapphire substrate 11 by MOVPE (FIG. 2B). Then, a Ti film 13 is vacuum-deposited 20 nm thick (FIG. 2C) thereon, and then heated at 1000° C. for 30 min. in a mixed atmosphere of H$_2$ and NH$_3$. By the heat treatment, the Ti film 13 on the surface of the substrate is nitrided such that it is changed into a porous TiN 14 with a number of microscopic pores with an inside diameter of tens of nanometers by the agglomeration effect (FIG. 2D).

Then, it is placed in the HVPE reactor 10 as shown in FIG. 1 and an $Al_{0.05}Ga_{0.95}N$ thick film 17 is grown 500 μm thick on the seed (or base) substrate 8 (here, the substrate with the porous TiN 14 formed on the surface as shown in FIG. 2D corresponds to the seed (or base) substrate 8 as shown in FIG. 1) The growth temperature is set 1100° C. In this process, the stay time of the HCl gas introduced to the Ga melt reservoir 6 is adjusted to be about 30 sec. by controlling the flow rate of HCl. Further, Si doping is conducted by introducing $SiH_2Cl_2$ gas with a predetermined concentration through the doping tube (not shown) to adjust the Si concentration in the crystal to $3\times10^{18}$ cm$^{-3}$.

In the crystal growth process, a facet growth AlGaN 15 is grown on the initial stage (FIG. 2E) and then is combined each other to form a continuous film. About 100 μm is needed to allow the flattening of the crystal surface.

A number of voids 16 are formed on the interface of the porous film in the process of the HVPE growth (FIG. 2F). Therefore, the AlGaN thick film 17 is by itself separated from the sapphire substrate 11 after the growth. Then, by polishing the AlGaN thick film 17, the AlGaN free-standing substrate 18 with a diameter of 2 inches and a thickness of 420 μm is obtained (FIG. 2G).

The threading dislocation density of the obtained AlGaN free-standing substrate 18 measured by the cathode luminescence method is a relatively good value, $1\times10^7$ cm$^{-2}$. As the result of measuring the respective concentrations of H, C, O, Na, K, Cl, S, P, Fe, Cr, Ni and Ti by SIMS analysis, $5\times10^{17}$ cm$^{-3}$ of H and $6\times10^{17}$ cm$^{-3}$ of O are detected. It is assumed that the impurity detection is caused by that the stay time of HCl gas in the Ga melt reservoir 6 is not long enough to purify the source gas, and that the flattening does not occur early enough to shorten the facet growth period that is easy to absorb the impurity. Further, it is confirmed by the laser flash method that the thermal resistivity is relatively high, 0.6 Kcm$^2$/W.

Then, an LED structure as shown in FIG. 3 is fabricated by sequentially growing, on the AlGaN free-standing substrate 18 thus obtained, a 4 μm thick n-type GaN layer 21, an $In_{0.15}Ga_{0.85}N$/GaN-3-MQW active layer (with 3 nm thick well layers and 10 nm thick barrier layers) 22, a 40 nm thick p-type $Al_{0.1}Ga_{0.9}N$ layer 23, a 500 nm thick p-type GaN layer 24 by MOVPE.

The results of measurement as in Example 1 are 465 nm in average emission center wavelength and 10 nm in standard deviation, and the in-plane variation of the emission center wavelength is ±2.2%, which is significantly larger than Examples 1-3.

It is assumed that the above results are caused by that sufficient heating cannot be conducted due to the higher thermal resistivity of the substrate than Examples 1-3.

COMPARATIVE EXAMPLE 2

An AlGaN free-standing substrate is made by a process as shown in FIGS. 2A to 2G.

First, a sapphire substrate 11 with a diameter of 2 inches (=50.8 mm) is provided as a seed (or base) substrate (FIG. 2A). Then, a GaN film 12 is formed 300 nm thick on the sapphire substrate 11 by MOVPE (FIG. 2B). Then, a Ti film 13 is vacuum-deposited 20 nm thick (FIG. 2C) thereon, and then heated at 1000° C. for 30 min. in a mixed atmosphere of $H_2$ and $NH_3$. By the heat treatment, the Ti film 13 on the surface of the substrate is nitrided such that it is changed into a porous TiN 14 with a number of microscopic pores with an inside diameter of tens of nanometers by the agglomeration effect (FIG. 2D).

Then, it is placed in the HVPE reactor 10 as shown in FIG. 1 and an $Al_{0.1}Ga_{0.9}N$ thick film 17 is grown 500 μm thick on the seed (or base) substrate 8 (here, the substrate with the porous TiN 14 formed on the surface as shown in FIG. 2D corresponds to the seed (or base) substrate 8 as shown in FIG. 1) The growth temperature is set 1100° C. In this process, the stay time of the HCl gas introduced to the Ga melt reservoir 6 is adjusted to be about 30 sec. by controlling the flow rate of HCl. Further, Si doping is conducted by introducing $SiH_2Cl_2$ gas with a predetermined concentration through the doping tube (not shown) to adjust the Si concentration in the crystal to $3\times10^{18}$ cm$^{-3}$.

In the crystal growth process, a facet growth AlGaN 15 is grown on the initial stage (FIG. 2E) and then is combined each other to form a continuous film. About 100 μm is needed to allow the flattening of the crystal surface.

A number of voids 16 are formed on the interface of the porous film in the process of the HVPE growth (FIG. 2F). Therefore, the AlGaN thick film 17 is by itself separated from the sapphire substrate 11 after the growth. Then, by polishing the AlGaN thick film 17, the AlGaN free-standing substrate 18 with a diameter of 2 inches and a thickness of 420 μm is obtained (FIG. 2G).

The threading dislocation density of the obtained AlGaN free-standing substrate 18 measured by the cathode luminescence method is a relatively good value, $1\times10^7$ cm$^{-2}$. As the result of measuring the respective concentrations of H, C, O, Na, K, Cl, S, P, Fe, Cr, Ni and Ti by SIMS analysis, $6\times10^{17}$ cm$^{-3}$ of H and $8\times10^{17}$ cm$^{-3}$ of O are detected. It is assumed that the impurity detection is caused by that the stay time of HCl gas in the Ga melt reservoir 6 is not long enough to purify the source gas, and that the flattening does not occur early enough to shorten the facet growth period that is easy to absorb the impurity. Further, it is confirmed by the laser flash method that the thermal resistivity is significantly high, 1.0 Kcm$^2$/W.

Then, an LED structure as shown in FIG. 3 is fabricated by sequentially growing, on the AlGaN free-standing substrate 18 thus obtained, a 4 μm thick n-type GaN layer 21, an $In_{0.15}Ga_{0.85}N$/GaN-3-MQW active layer (with 3 nm thick well layers and 10 nm thick barrier layers) 22, a 40 nm thick p-type $Al_{0.1}Ga_{0.9}N$ layer 23, a 500 nm thick p-type GaN layer 24 by MOVPE.

The results of measurement as in Example 1 are 465 nm in average emission center wavelength and 13 nm in standard deviation, and the in-plane variation of the emission center wavelength is ±2.8%, which is significantly larger than Examples 1-3.

It is assumed that the above results are caused by that sufficient heating cannot be conducted due to the higher thermal resistivity of the substrate than Examples 1-3.

COMPARATIVE EXAMPLE 3

An AlGaN free-standing substrate is made by a process as shown in FIGS. 2A to 2G.

First, a sapphire substrate 11 with a diameter of 2 inches (=50.8 mm) is provided as a seed (or base) substrate (FIG. 2A). Then, a GaN film 12 is formed 300 nm thick on the sapphire substrate 11 by MOVPE (FIG. 2B). Then, a Ti film 13 is vacuum-deposited 20 nm thick (FIG. 2C) thereon, and then heated at 1000° C. for 30 min. in a mixed atmosphere of $H_2$ and $NH_3$. By the heat treatment, the Ti film 13 on the surface of the substrate is nitrided such that it is changed into a porous TiN 14 with a number of microscopic pores with an inside diameter of tens of nanometers by the coalescence effect (FIG. 2D).

Then, it is placed in the HVPE reactor 10 as shown in FIG. 1 and an $Al_{0.5}Ga_{0.5}N$ thick film 17 is grown 500 μm thick on the seed (or base) substrate 8 (here, the substrate with the porous TiN 14 formed on the surface as shown in FIG. 2D corresponds to the seed (or base) substrate 8 as shown in FIG. 1). The growth temperature is set 1100° C. In this process, the stay time of the HCl gas introduced to the Ga melt reservoir 6 is adjusted to be about 30 sec. by controlling the flow rate of HCl. Further, Si doping is conducted by introducing $SiH_2Cl_2$ gas with a predetermined concentration through the doping tube (not shown) to adjust the Si concentration in the crystal to $3\times10^{18}$ $cm^{-3}$.

In the crystal growth process, a facet growth AlGaN 15 is grown on the initial stage (FIG. 2E) and then is combined each other to form a continuous film. About 200 μm is needed to allow the flattening of the crystal surface.

A number of voids 16 are formed on the interface of the porous film in the process of the HVPE growth (FIG. 2F). Therefore, the AlGaN thick film 17 is by itself separated from the sapphire substrate 11 after the growth. Then, by polishing the AlGaN thick film 17, the AlGaN free-standing substrate 18 with a diameter of 2 inches and a thickness of 420 μm is obtained (FIG. 2G).

The threading dislocation density of the obtained AlGaN free-standing substrate 18 measured by the cathode luminescence method is a relatively good value, $1\times10^7$ $cm^{-2}$. As the result of measuring the respective concentrations of H, C, O, Na, K, Cl, S, P, Fe, Cr, Ni and Ti by SIMS analysis, $8\times10^{17}$ $cm^{-3}$ of H and $1\times10^{18}$ $cm^{-3}$ of O are detected. It is assumed that the impurity detection is caused by that the stay time of HCl gas in the Ga melt reservoir 6 is not long enough to purify the source gas, and that the flattening does not occur early enough to shorten the facet growth period that is easy to absorb the impurity. Further, it is confirmed by the laser flash method that the thermal resistivity is significantly high, 1.5 $Kcm^2/W$.

Then, an LED structure as shown in FIG. 3 is fabricated by sequentially growing, on the AlGaN free-standing substrate 18 thus obtained, a 4 μm thick n-type GaN layer 21, an $In_{0.15}Ga_{0.85}N$/GaN-3-MQW active layer (with 3 nm thick well layers and 10 nm thick barrier layers) 22, a 40 nm thick p-type $Al_{0.1}Ga_{0.9}N$ layer 23, a 500 nm thick p-type GaN layer 24 by MOVPE.

The results of measurement as in Example 1 are 465 nm in average emission center wavelength and 18 nm in standard deviation, and the in-plane variation of the emission center wavelength is ±3.9%, which is significantly larger than Examples 1-3.

It is assumed that the above results are caused by that sufficient heating cannot be conducted due to the higher thermal resistivity of the substrate than Examples 1-3.

COMPARATIVE EXAMPLE 4

An AlGaN free-standing substrate is made by a process as shown in FIGS. 4A to 4G.

Figure 4A:
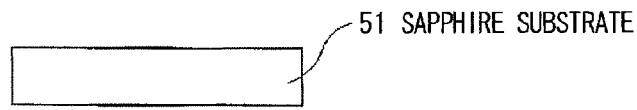
FIGS. 4A to 4F are schematic cross sectional views showing a method of making an AlGaN free-standing substrate in Comparative Examples 4-6.
Figure 4B:
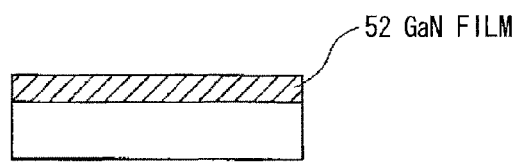
Figure 4C:
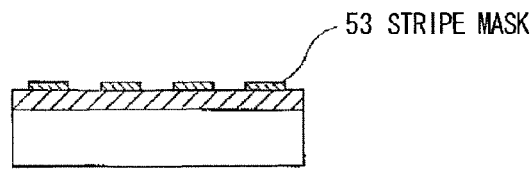
Figure 4D:
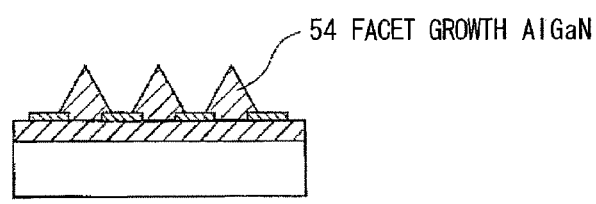

First, a sapphire substrate 51 with a diameter of 2 inches (=50.8 mm) is provided as a seed (or base) substrate (FIG. 4A). Then, a GaN film 52 is formed 300 nm thick on the sapphire substrate 51 by MOVPE (FIG. 4B). Then, a $SiO_2$ stripe mask 53 is formed on the surface by the photolithography (FIG. 4C). Mask width and opening width thereof are 15 μm and 10 μm, respectively.

Then, it is placed in the HVPE reactor as shown in FIG. 1 and an $Al_{0.1}Ga_{0.9}N$ thick film 55 is grown 1 mm thick on the seed (or base) substrate 8 (here, the substrate with the stripe mask 53 formed on the surface as shown in FIG. 4C corresponds to the seed (or base) substrate 8 as shown in FIG. 1). The growth temperature is set 1100° C. In this process, the stay time of the HCl gas introduced to the Ga melt reservoir 6 is adjusted to be about 2 min. by controlling the flow rate of HCl. Further, Si doping is conducted by introducing $SiH_2Cl_2$ gas with a predetermined concentration through the doping tube (not shown) to adjust the Si concentration in the crystal to $3\times10^{18}$ $cm^{-3}$.

Figure 4E:
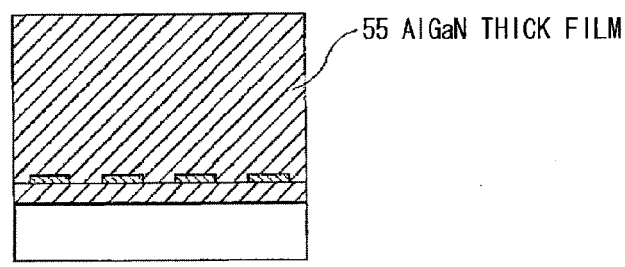

The crystal growth starts from the opening of the stripe mask 53 and then a facet growth AlGaN 54 is extended gradually in the lateral direction (FIG. 4D) and then a flattened surface is finally formed to have an AlGaN thick film 55 (FIG. 4E). About 100 μm is needed to allow the flattening of the crystal surface.

Figure 4F:
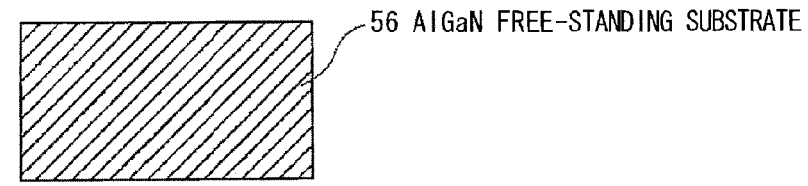

After the growth, the AlGaN thick film 55 is separated from the sapphire substrate 51 by the laser separation to have an AlGaN free-standing substrate 56 (FIG. 4F).

However, a number of cracks are generated in the crystal during the separation process. Thus, it is impossible to make any substrate enough for practical use.

COMPARATIVE EXAMPLE 5

By conducting the same steps as Comparative Example 4, a 3 mm thick AlGaN is grown. Again trying the laser separation, the substrate is separated without generating any cracks, maybe, due to the sufficient thickness. Polishing both surfaces of the AlGaN crystal, an AlGaN free-standing substrate 56 with a diameter of 2 inches and a thickness of 430 μm is obtained.

The threading dislocation density of the obtained AlGaN free-standing substrate 56 measured by the cathode luminescence method is $3\times10^7$ $cm^{-2}$. As the result of measuring the respective concentrations of H, C, O, Na, K, Cl, S, P, Fe, Cr, Ni and Ti by SIMS analysis, $9\times10^{17}$ $cm^{-3}$ of H and $12\times10^{18}$ $cm^{-3}$ of O are detected. Further, it is confirmed by the laser flash method that the thermal resistivity is significantly high, 1.9 $Kcm^2/W$.

Polished damages are left on the surface of the AlGaN free-standing substrate 56, maybe, due to the long-time polishing. Then, epitaxial growth is tried to fabricate an LED structure on the AlGaN free-standing substrate. However, cracks generated are too many to evaluate it.

COMPARATIVE EXAMPLE 6

By the same steps as Comparative Example 5, a 3 mm thick AlGaN is grown. Polishing the AlGaN crystal, an AlGaN free-standing substrate 56 with a diameter of 2 inches and a thickness of 2 mm is obtained.

The threading dislocation density of the obtained AlGaN free-standing substrate 56 measured by the cathode luminescence method is high, $3\times10^7$ $cm^{-2}$. Further, it is confirmed by the laser flash method that the thermal resistivity is significantly high, 2.0 $Kcm^2/W$. It is assumed that the high thermal resistivity is caused by the high threading dislocation density and defects generated by the stress field thereof.

An LED structure as shown in FIG. 3 is fabricated on the substrate 56 by MOVPE.

The results of measurement as in Example 1 are 465 nm in average emission center wavelength and 20 nm in standard deviation, and the in-plane variation of the emission center wavelength is ±4.3%, which is significantly larger than Examples 1-3. It is assumed that the above results are caused by that, as the result that warping occurs due to the high thermal resistivity of the substrate 56, temperature at the outer circumference lowers so that the indium composition of the InGaN active layer increases thereat as compared to the center portion.

OTHER APPLICATIONS AND MODIFICATIONS

Although the above embodiments of the invention are applied to the AlGaN free-standing substrate and the fabrication method, the invention can be also applied to a single-crystal free-standing substrate formed of three-element mixed crystal, InGaN or four-element mixed crystal, AlInGaN and its fabrication method.

Although the above embodiments of the invention use the HVPE growth method, the invention can use various growth methods such as MOVPE, MBE, a flux method using Na etc.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A nitride-based semiconductor free-standing substrate, comprising:
a free-standing substrate consisting of a nitride-based semiconductor crystal,
wherein the nitride-based semiconductor crystal comprises a mixed crystal composition with three elements or more,
wherein the substrate has a diameter of not less than 25 mm, a thickness of not less than 250 µm, and a thermal resistivity in a range of 0.02 Kcm$^2$/W to 0.5 Kcm$^2$/W in a thickness direction of the substrate,
wherein the substrate comprises a total point defect concentration of not more than $1\times10^{18}$ cm$^{-3}$, the point defect concentration excluding a dopant for controlling conductivity of the substrate.

2. The nitride-based semiconductor free-standing substrate according to claim 1, wherein:
the mixed crystal composition comprises $Al_xGa_{1-x}N$ (0.05<x<0.95).

3. The nitride-based semiconductor free-standing substrate according to claim 1, wherein:
the mixed crystal composition comprises $In_yGa_{1-y}N$ (0.05<y<0.95).

4. The nitride-based semiconductor free-standing substrate according to claim 1, wherein:
the mixed crystal composition comprises $Al_zIn_pGa_{1-z-p}N$ (0.05<z+p <0.95, z≠0, p≠0).

5. The nitride-based semiconductor free-standing substrate according to claim 1, wherein:
the substrate further comprises a threading dislocation density of not more than $1\times10^7$ cm$^{-2}$.

6. An epitaxial substrate for a nitride-based semiconductor light emitting device, comprising:
the nitride-based semiconductor free-standing substrate as defined in claim 1; and
a light emitting layer comprising a nitride-based semiconductor grown epitaxially on the nitride-based semiconductor free-standing substrate.

7. A method of making a nitride-based semiconductor free-standing substrate, comprising the steps of:
providing a hetero-substrate comprising a sapphire substrate with a diameter of not less than 25 mm;
epitaxially growing, on the hetero-substrate, a nitride-based semiconductor crystal comprising a mixed crystal composition with three elements or more and a thickness of not more than 2 mm; and
removing the hetero-substrate to have the nitride-based semiconductor free-standing substrate having a thickness of not less than 250 µm comprising a thermal resistivity in a range of 0.02 Kcm$^2$/W to 0.5 Kcm$^2$/W in its thickness direction,
wherein the substrate comprises a total point defect concentration of not more than $1\times10^{18}$ cm$^{-3}$, the point defect concentration excluding a dopant for controlling conductivity of the substrate.

8. The method according to claim 7, further comprising:
forming a void at an interface between the hetero-substrate and the nitride-based semiconductor crystal; and
then breaking the void to remove the hetero-substrate.

* * * * *